US005690795A

United States Patent [19]
Rosenstein et al.

[11] Patent Number: 5,690,795
[45] Date of Patent: Nov. 25, 1997

[54] SCREWLESS SHIELD ASSEMBLY FOR VACUUM PROCESSING CHAMBERS

[75] Inventors: Michael Rosenstein, Sunnyvale; Howard Grunes, Santa Cruz, both of Calif.; Stephen Bruce Brodsky, Fishkill, N.Y.

[73] Assignees: Applied Materials, Inc., Santa Clara, Calif.; International Business Machines Corporation, Amonk, N.Y.

[21] Appl. No.: 463,463

[22] Filed: Jun. 5, 1995

[51] Int. Cl.[6] ............................ C23C 14/34; C23C 16/00; C23F 1/02
[52] U.S. Cl. .................. 204/192.1; 204/192.12; 204/298.11; 156/345; 118/715; 118/504; 118/720; 118/721
[58] Field of Search ............... 204/192.1, 192.12, 204/298.11, 298.12; 156/345; 118/715, 720, 721, 723 E, 504

[56] References Cited

U.S. PATENT DOCUMENTS

| 5,223,111 | 6/1993 | Lueft | 204/298.11 |
|---|---|---|---|
| 5,368,648 | 11/1994 | Sekizuka | 118/733 |
| 5,419,029 | 5/1995 | Raaijmakers | 29/447 |
| 5,518,593 | 5/1996 | Hosokawa et al. | 204/298.11 |
| 5,538,603 | 7/1996 | Guo | 204/298.11 |
| 5,565,071 | 10/1996 | Demaray et al. | 204/192.12 |

OTHER PUBLICATIONS

European Search Report dated Sep. 23, 1996, for European Patent Application Number 96304056.3.

*Primary Examiner*—R. Bruce Breneman
*Assistant Examiner*—Rodney G. McDonald
*Attorney, Agent, or Firm*—Janis Biksa

[57] ABSTRACT

A structure and method is described for securing an overspray shield in processing chambers in the wall sandwich of the chamber or using a dimensionally compliant floating spacer ring to elastically clamp the overspray shield in position in a vacuum substrate processing chamber without the use of removable fasteners. The configuration uses the differential pressures between the inside and outside of the chamber to clamp the overspray shield along with its shield clamping assembly components at a spacer position in the chamber. The spacer position is generally interior to vacuum sealing limits of the chamber. The arrangement is such that if misalignment occurs a good vacuum-type seal cannot be achieved unless the parts are moved to correct alignment. When correctly aligned the overspray shield is tightly held to the processing chamber wall and electrical continuity between the processing chamber wall and the overspray shield is assured throughout expected process conditions.

16 Claims, 8 Drawing Sheets

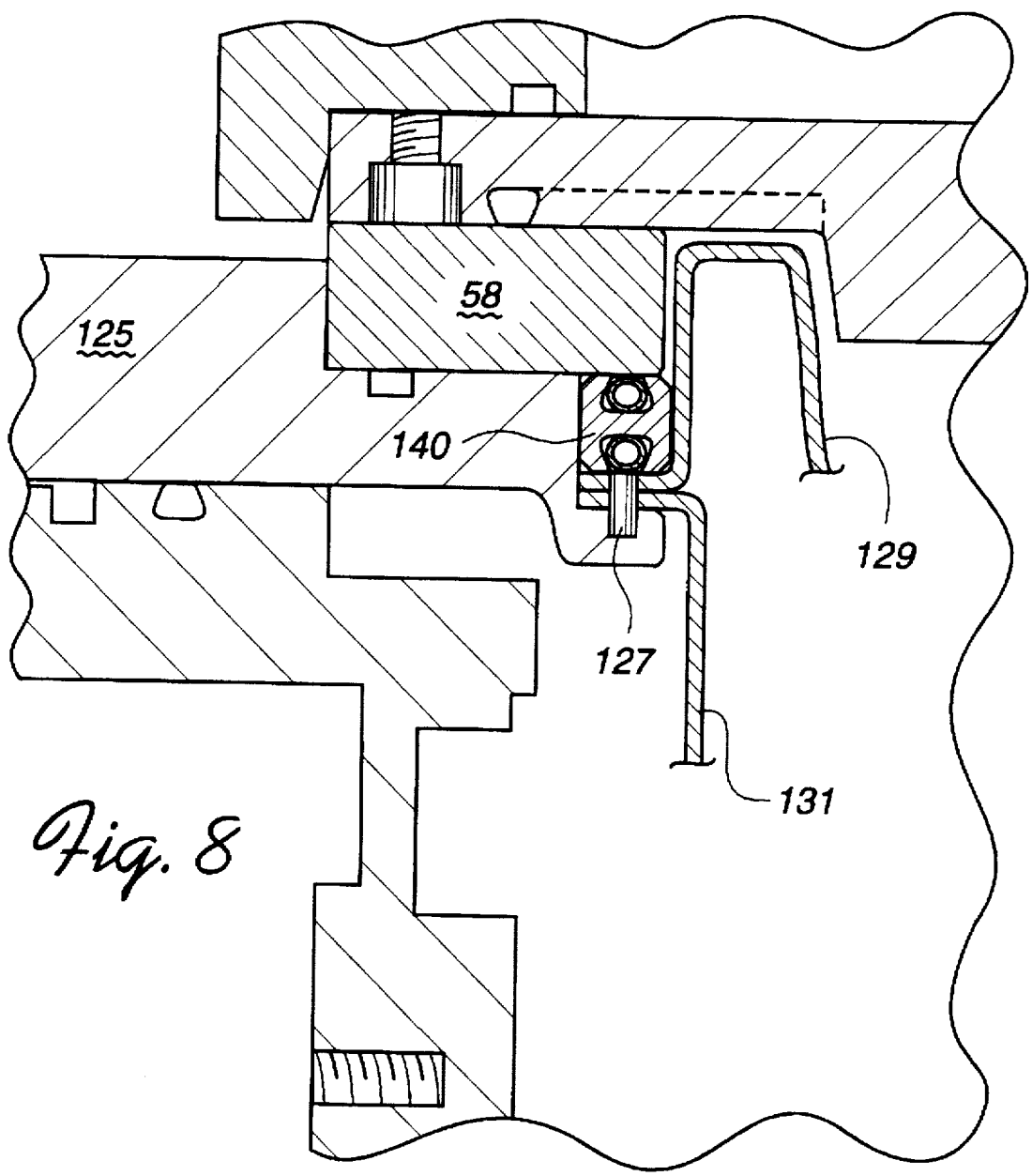

SCREWLESS SHIELD ASSEMBLY FOR VACUUM PROCESSING CHAMBERS

FIELD OF THE INVENTION

This invention relates to substrate processing in vacuum processing chambers and in particular to the configuration and method of mounting of shields or liners within such chambers.

BACKGROUND OF THE INVENTION

In the semiconductor industry vacuum chambers are used to deposit materials on, or etch materials from the surface of substrates. Some examples of the types of materials deposited include thin films of aluminum and aluminum alloys, refractory metal silicides, gold, copper, titanium-tungsten, tungsten, molybdenum, and silicon dioxide and silicon on an item, for example a substrate or wafer being processed. Ion, chemical, and plasma based etching is also performed in vacuum chambers. In many of these chambers the actual geometric arrangement of the substrate relative to the source from which the material being deposited determines the uniformity, quality, and efficiency of the material deposited or of the etching taking place. Typically a gas distribution plate or a sputtering target or ion source is placed opposite the substrate being processed. Processing occurs when active elements in the chamber contact the surface of the substrate being processed. For example when a reactive gas, in some cases charged to form a plasma, comes in contact with the surface of the substrate deposition occurs. Chemicals or ions which form part of an etch process also perform their function only when they contact the surface of the substrate (sometimes selectively).

Even though the space between the source of active elements, e.g. a gas distribution plate or an ion source, is usually small the scatter of the active particles in all directions causes the surface of the surrounding members to receive the same effect that is being directed toward the substrate being processed. The surrounding members are typically the walls of the vacuum processing chamber. The walls of the vacuum processing chamber could and do thereby become coated or etched (if affected by the etch process) during the processing of the substrate. Built-up deposited material can flake off creating particulates which can create defects when they land on the substrate surface. The surfaces of members surrounding the processing location are therefore periodically cleaned to reduce or nearly eliminate the likelihood that flaking from surrounding members will create defects. The walls of vacuum chambers in which etching occurs can wear away over time requiring that the wall of the chamber be replaced. Etching and mechanical abrasion are used in nearly all deposition chambers to remove the build-up of deposited material. Therefore the wear that takes place in etch chambers is also experienced in deposition chambers. Since the surfaces surrounding the substrate processing location are usually the walls of the vacuum processing chamber, excessive wear could require replacement of the walls of the processing chamber. Which is both time consuming and expensive.

To postpone the replacement of such walls the surfaces of surrounding members are often lined by chamber shields which directly face the substrate processing location and shield the walls and surfaces of other surrounding components from the deleterious effects of the process acting on the substrate being processed. Such shields, usually electrically conductive, in many cases they must be in electrical contact (have continuity) with the surrounding surfaces to avoid discontinuities in the electrical and magnetic fields which contribute to the qualities and properties desired as materials are deposited on or etched from the surface of the substrate being processed.

For example, an existing PVD chamber (i.e., sputtering chamber), is shown in FIG. 1. A substrate 30 to be processed at a substrate processing location is shown in an evacuated processing chamber 20. The substrate 30 is supported on a pedestal 28 and faces a target assembly 60, the source of the material to be sputter deposited. The wall 22 of the chamber is sealed by O-rings 26, 40 and 74. The target assembly O-ring 74 seals the top (target) opening of the processing chamber to provide a gas tight chamber which can be evacuated. In use, the target assembly 60 is electrically biased (charged) to a predetermined voltage to facilitate sputtering. The target assembly 60 is therefore electrically isolated from the grounded or neutral potential chamber wall by an insulating ring 58 (often made of a ceramic material).

From the configuration as shown in FIG. 1 it is clear that the target assembly 60 is larger than the substrate 30. The size differential provides for nearly uniform bombardment of free atoms from all directions to sputter deposit material on the surface of the smaller substrate which improves the coverage and uniformity of thin film deposited. However, targets (especially larger targets like the one shown) when sputtered will sputter deposit material (free atoms) not only on the substrate being sputtered, but also all other surfaces which are directly exposed to the path of free atoms from target surface (i.e. substrate processing location). Outside the area of the substrate, the "overspray" of sputter deposited material coats all surfaces exposed to the sputter processing location. As a result target material is deposited to build up on and potentially contaminate all exposed surfaces. The surfaces facing the substrate processing location which are closer to the target surface generally receive a higher concentration of particles than surfaces farther away (the inverse square of the distance relationship), thus the thickness of sputter deposited material builds up more quickly on surfaces which are closer to the target surface and less quickly on more distant surfaces.

Other vacuum chamber substrate processing chamber configurations do not include a target assembly, but include some type of chamber opening covering member such as a gas distribution plate which is a source for material to be deposited or for etchant gas.

Overspray shields have been developed as partial or full chamber liners to reduce and/or eliminate the need to repeatedly clean the walls of the processing chamber to remove material deposited on their surface.

As pictured in FIG. 1, an overspray shield assembly 42 (typically aluminum, stainless steel or titanium) is roughly finished by either stamping or spinning it into its final configuration. These processes for forming the overspray shield are economical, but result in an imprecise dimensional tolerance and rough surface finish for the thickness of the shield flange 46. To eliminate any deleterious effect of the imprecise dimension (such as providing resistance to electrical conductivity), the shield flange 46 is clamped to an adapter ring 36 by a circumferential clamping ring 52 held tightly by a series of 8 to 16 clamping screws 54. The clamping ring 52 is configured to fit loosely into the space above the shield flange 46 and together with a close portion of the shield is oriented to provide a dark space ring gap 72—which provides a prescribed clearance between the target and its immediately adjacent pieces to deter sputtering of the edge of the target. The gap 56 between the clamping ring 52 and an insulating ring 58 results from the loose fit between the clamping ring 52 and its adjacent pieces (the insulating ring 58 and the target assembly 60) and is maintained to accommodate the largest expected dimensional variations in the thickness of the shield flange.

The shield assembly 42 includes a shield body portion 44 which has a generally annular shape and is generally configured to span the gap between the wall of the process chamber adjacent to the target surface (adjacent to the dark space ring gap 72) and the edge of the pedestal 28 supporting the substrate 30 being processed.

Clamping of the shield flange 46 to the adapter ring 36 attempts to assure that the shield 44 is electrically grounded or neutral (i.e., tied to the adapter ring 36) so that a uniform electrical potential with the chamber wall can be maintained to avoid distorting the deposition pattern due to variations in the charge (potential) present in surrounding members. Electrical connection (continuity) is ostensibly assured by a clamping ring 52 which clamps the shield flange 46 to a shelf 50 of the adapter ring 36. The adapter ring 36 is positioned on top of the circular opening of the flange and acts as part of the wall of the processing chamber assembly. An insulator ring 58 sits on the adapter ring 36 and O-rings 26, 40, 74 in O-ring grooves 24, 38, 74 are provided to seal the wall of the processing chamber assembly.

In use, the overspray shield 44 as shown in FIG. 1 must be periodically (e.g., weekly) removed and replaced (otherwise the build-up of material on this shield could flake off particulates which might contaminate the substrate being processed). This requires that the adapter ring 36 still clamped to the shield assembly 42 be removed. The screws 54 can then be unscrewed to release the clamping ring 52 and shield flange 46. A new shield assembly 42 can then be attached to the adapter ring 36 by re-tightening the screws 54 holding the clamping ring 52. The adapter ring 36 with the shield assembly 42 clamped to it must then be placed back in position and precisely positioned in relation to adjacent members to assure that the processing chamber can be sealed for subsequent evacuation and processing.

The weekly or more frequent release and re-tightening of the many screws 54 around the clamping ring 52 causes rubbing between adjacent metal pieces which generates micron size particles which can and do act as particulates deleterious to the PVD process in the evacuated environment of the processing chamber. The metal particles generated can and do find their way to the substrate being sputter deposited. In some instances the introduction of a potentially conductive particulate will create a change in electrical properties on the substrate which will cause rejection of the entire substrate. Every rejected substrate reduces overall productivity.

Similarly, the disassembly and reassembly of the adapter ring assembly using screws and dependence on correct tightening of the screws by technicians creates the risk of the screwed joint loosening under the repeated thermal cycling and vibration of the process environment. If the clamping is not done properly a good electrical contact between adjacent members is not made and then the bias voltage at the substrate level (ion current) (normally 20 volts DC) can increase (to 50 or 100 volts DC), to achieve conditions under which arcing (which also generates undesirable particles) can occur.

The gas in the chamber is usually argon or nitrogen at pressures of one to 10 millitorr. These pressures facilitate reactive sputtering using $N_2$ to treat the surfaces, for example creating titanium nitrate.

The repeated removal and replacement of the shield assembly 42 and removal and replacement of the clamping ring 52 and the screws 54 holding the clamping ring in place generates undesirable particulates, which if eliminated, will reduce the down time and increase productivity in PVD and other vacuum processing chambers. The removal and replacement of removable screws in the shield assembly arrangement is also a time-consuming activity which can delay subsequent processing steps.

SUMMARY OF INVENTION

This invention eliminates particulates generated in the prior art, for example from rubbing contact, by providing a structure and method which includes nearly direct access to the overspray shield for removal and replacement without the need to remove an adapter ring and/or spend the time to remove and re-tighten screws to clamp a shield in place.

A configuration according to the invention includes a loose sandwich of rings (a shield clamping assembly) positioned and clamped during processing between a top surface of the walls of the processing chamber and a flange of the chamber opening cover member (the target—in PVD chambers). When the chamber assembly is properly assembled a vacuum tight seal is achieved; when not properly assembled gaps for leakage exist and no seal is achieved. In use, the differential pressure between the evacuated processing chamber and the ambient pressure around the processing chamber creates a tremendous clamping forces which compresses the shield clamping assembly (e.g., a shield separately or as part of a loose sandwich of rings) to tightly hold the flange of an overspray shield (also part of the shield clamping assembly and in some instances the only component of the shield clamping assembly extending beyond the wall of the processing chamber and its chamber opening cover member in electrical contact with its adjacent conductive members (i.e., the adapter ring and/or the wall(s) of the processing chamber).

In one configuration the outer flange of the shield is precisely manufactured with dimensional tolerances and a surface finish which are conducive to being captured in the flange sandwich of the processing chamber and to act as part of the seal sealing the vacuum chamber. The flange generally includes continuous sealing surfaces on its surfaces against which O-rings can be placed for sealing.

In another configuration which can be compared with the prior art configuration described in the Background of the Invention, uses a shield configuration having a flange with the dimensional variations of economically manufactured shields. A ledge or shelf of the adapter ring supports a spacer ring having two O-ring type circumferential grooves at a spacer location between the adapter ring and the insulator ring. The two O-ring type grooves are filled with an elastic (spring) member. (Preferably a hollow spring O-ring shaped member—a metal ribbon tightly wounded in a spiral so that the outside of the spiral forms a generally circular hollow core cylinder, the ends of which are joined or brought into close contact with one another. From the outside the spring member tends to look like an O-ring with some spiral grooves or openings.) The side surface of the elastic members extend beyond the mouths of the spacer ring grooves and act as a compliant set of continuous spring contacts to maintain electrical continuity between the spacer ring and its adjacent conductive members. The elastic (compressive) range of such a spacer ring effectively accommodates variations in the thickness of the shield flange while continuing to assure electrical contact with it.

In the configuration described, the shield clamping assembly includes a loose sandwich of rings including: the perimeter top edge flange of the overspray shield, a spacer ring, and a floating clamping ring. The floating clamping ring in one configuration sits on top of the perimeter flange of the overspray shield and is clamped tightly to it by the insulator ring which presses the floating clamping ring toward the fixed upper flange of the processing chamber. Under process conditions when a vacuum is present in the processing chamber, the shield clamping assembly tightly holds the overspray shield in electrical contact with the adapter ring and the wall(s) (one or more) of the processing chamber.

A configuration according to the invention provides easy maintenance of the shield assembly such that once the chamber opening cover member and insulator ring are removed only a floating clamping ring need be removed in order to access, remove, and replace the shield flange and its associated shield assembly. In another configuration the spacer ring can function as a clamping ring. While it may be possible to eliminate the clamping ring function apart from the compliant spacer ring function, such a configuration is not preferred as the non-uniformities in the thickness of the overspray shield flange can cause areas of variable stress around the circumference of the insulating ring. Since the insulating ring is generally made of a brittle ceramic material, large variation (or concentration) in stress may contribute to cracking and failure of the insulator ring. Therefore it is better to have an intermediate member (i.e., a clamping ring) with a precisely manufactured surface to face the insulating ring so that the variations in stress and its distribution can take place in the intermediate member which is usually a malleable metal tolerant of variations in stress.

In yet another configuration, the flange of the shield assembly is configured such that the shield flange is positioned below the spacer ring which is directly adjacent to the insulator ring above. In this configuration the spacer ring provides both elastic compliant contact with the shield flange and also acts as the intermediate member to distribute potential high stresses due to variations in the shield flange thickness dimension.

Other configurations to clamp the shield perimeter flange are possible. Such configurations include, but are not limited to, a perimeter shield flange positioned at a spacer location adjacent to the chamber wall assembly, the actual position of the spacer location and the angular orientation of the perimeter flange may vary (e.g., be inclined at 45 degrees), as long as the mating pieces (sandwich) of surrounding vacuum sealing members are in contact to provide a vacuum seal and the shield is in electrical contact with the chamber wall directly or through an adapter plate.

BRIEF DESCRIPTION OF THE DRAWINGS

FIG. 8 is a cross section of a wall of a processing chamber according to the invention configured to capture two flanges of shield members; the flanges located adjacent to one another on one side of a spacer ring according to the invention;

DETAILED DESCRIPTION

The present invention reduces the potential for particulate generation and facilitates easy insertion and removal of an overspray shield used in a substrate processing chamber by providing easy dis-assembly and re-assembly of the chamber wall including an edge flange around a processing chamber opening. A substrate processing chamber opening cover member fills the chamber opening and seals the opening. The differential pressure across the cover member creates a force to clamp the cover member to the flange of the chamber edge flange. An outer flange of a chamber inner shield is configured to be clamped by the clamping force clamping said cover member to said chamber edge flange.

In one configuration the flange is positioned within the sandwich of the chamber flange assembly and forms part of the chamber wall which creates the pressure (vacuum) seal sealing the chamber from outside atmosphere and also assures electrical continuity with the wall of the chamber. When the pieces in the flange sandwich are properly aligned they mate, so that the chamber can seal and a vacuum can be produced in the chamber. When alignment is not correct adjacent pieces do not mate and a tight vacuum cannot be maintained.

In another configuration an assembly of the chamber wall includes an outside seal and an inner compliant elastic fixture (structure) for holding (clamping) the overspray shield and assuring electrical continuity with the walls of the processing chamber (assembly) while providing easy screwless assembly of components.

Figure 2:
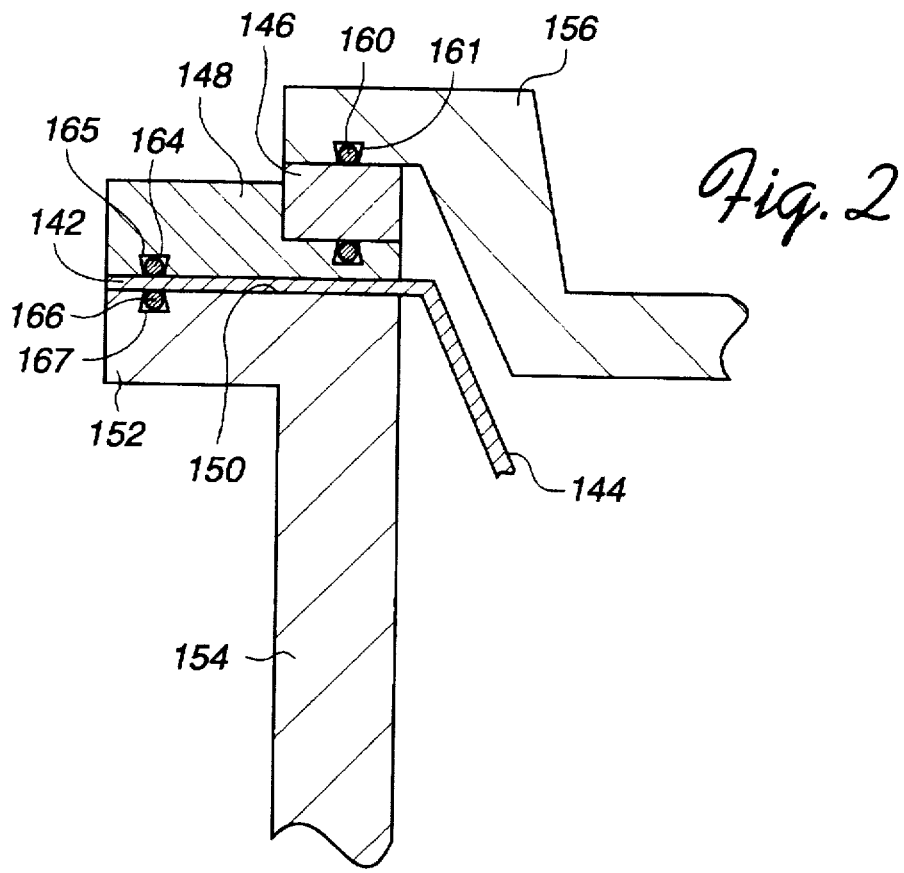
FIG. 2 is a cross sectional view of a chamber sidewall construction according to the invention, showing a flange of an overspray shield sealed in the flange sandwich.

FIG. 2 shows a cross section of chamber flange sandwich which is configured to capture a flange 142 of the top portion of the shield 144 between the top surface 150 of the flange 152 of the chamber wall 154 and the bottom of a clamping ring 148. The clamping ring 148 supports an insulator ring 146 which supports a chamber opening covering member 156. O-rings 160, 162, 164, 166 disposed in O-ring grooves 161, 163, 165, 167 provide seals between adjacent pieces.

Figure 2A:
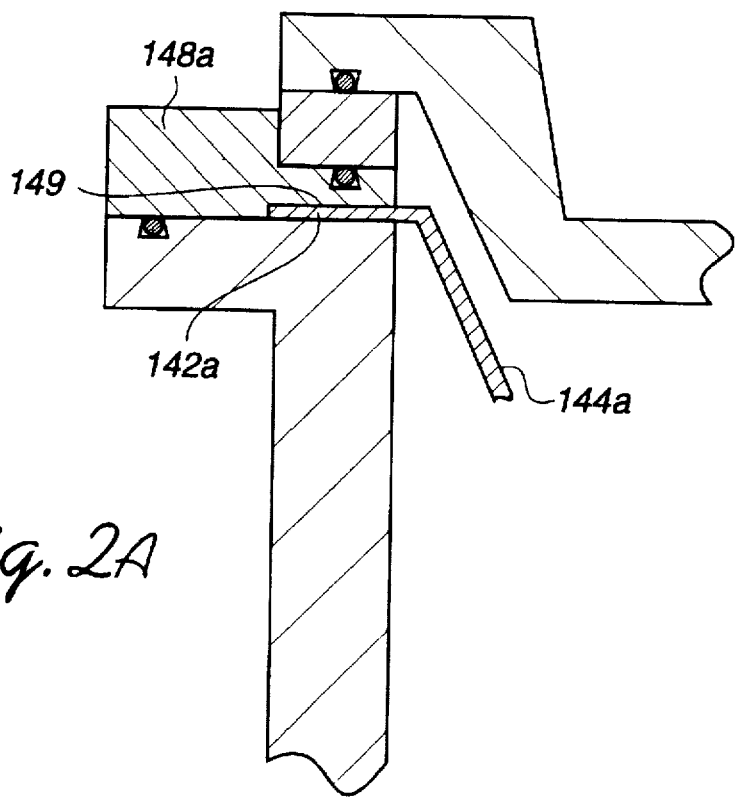
FIG. 2A is a cross sectional view of a chamber sidewall construction according to the invention, showing a flange of an overspray shield clamped in the flange sandwich, but with the chamber seal path outside the shield flange.

FIG. 2A shows a cross section of chamber flange sandwich similar to FIG. 2 except that a flange 142a of the top portion of the shield 144a is captured and clamped between the top surface 150 of the flange 152 of the chamber wall 154 and the bottom of a clamping ring 148a. The clamping ring 148a includes a recess 149 whose depth is equal to the thickness of the flange 142a of the shield 144a. The fit/interference between the flange 148a and the chamber pieces being such that good electrical contact is achieved between the flange and the chamber wall, but the interference between pieces is not so great that it interferes with achieving a tight vacuum seal. The chamber seal path as shown in FIG. 2A is around the edge of the shield flange, while in FIG. 2 it includes and is through the shield flange.

Figure 1:
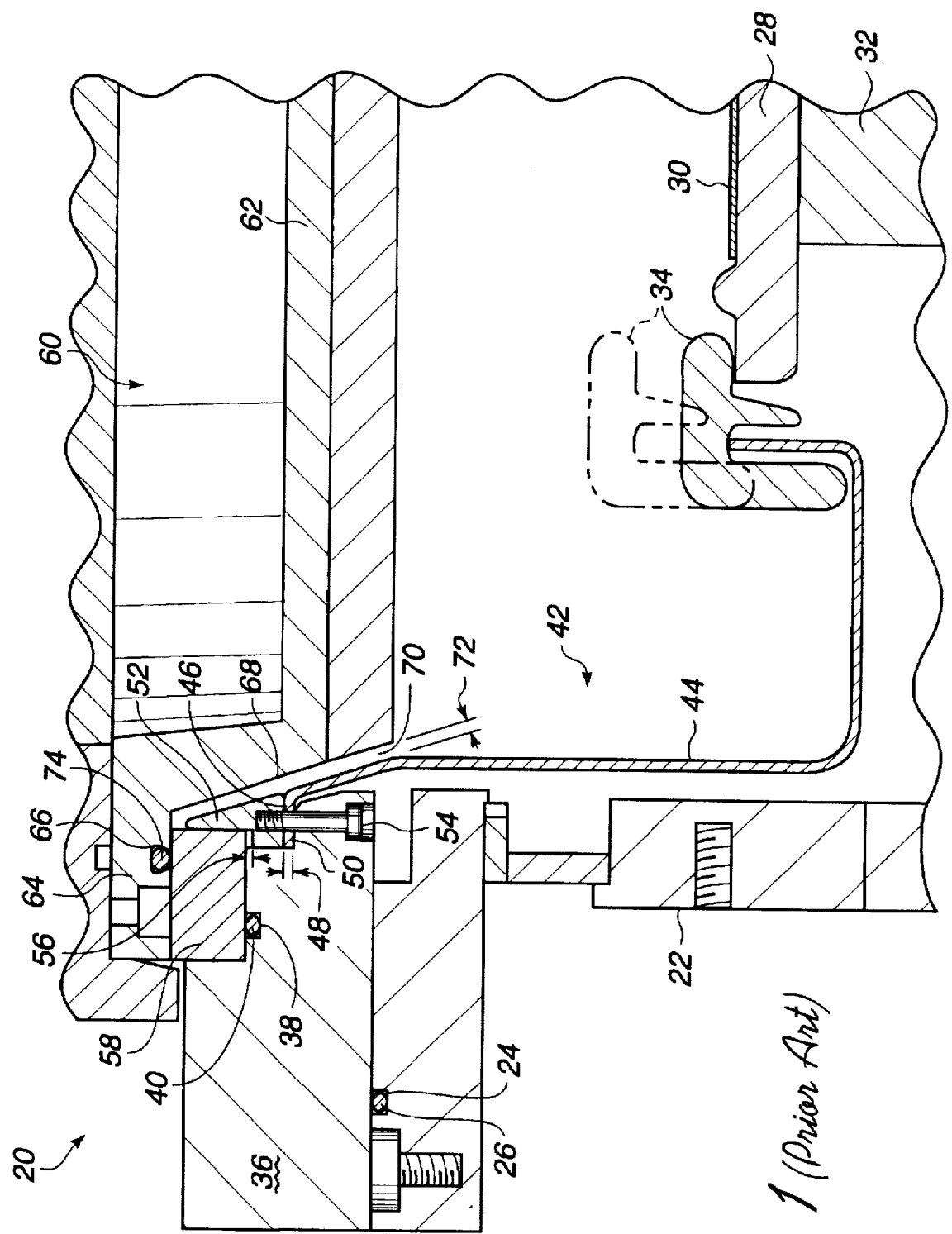
FIG. 1 is a cross section of a prior art PVD processing chamber using a screw clamped overspray shield.
Figure 3:
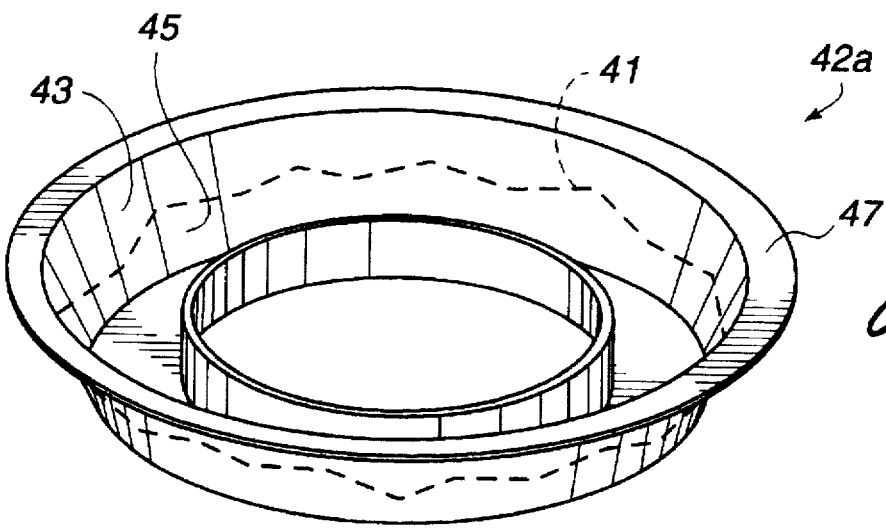
FIG. 3 is perspective view of a overspray shield of the type illustrated in FIG. 1 split along a dashed line.

FIG. 3 shows a shield configuration 42a of the type shown in FIG. 1, (prior art) discussed above. For the purposes of this discussion the actual shape of the shield 42a below the dashed line 41, separating the top portion 43 adjacent to the flange from the lower portion 45 is not important, but may be any configuration to act as a shield for the walls from the process being performed in the vacuum processing chamber.

Figure 4:
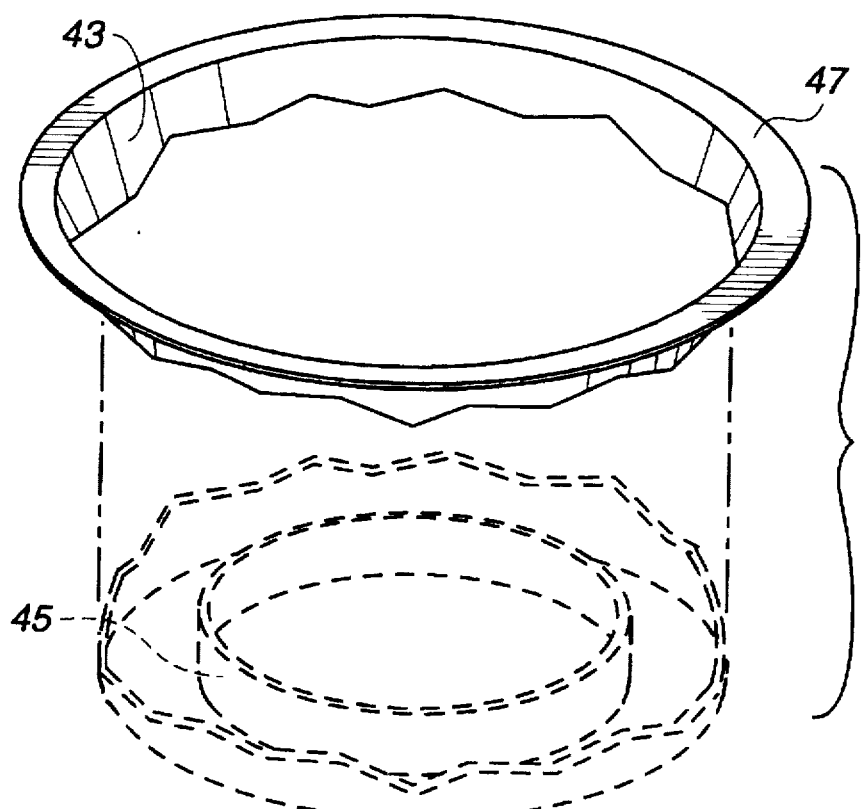
FIG. 4 is an exploded perspective view of the overspray shield of FIG. 3, with the upper (flange) portion being shown in solid lines separated from the lower portion shown in dashed lines

FIG. 4 shows the separated sections of the shield 42a of FIG. 3. The bottom portion 45 shown in dashed lines could be configured in any particular shape desired for a particular process chamber configuration. The upper portion 43 including an outwardly extending flange 47 which is captured or clamped to the chamber wall to achieve good electrical contact and to hold the shield securely without excessive vibration.

Figure 5:
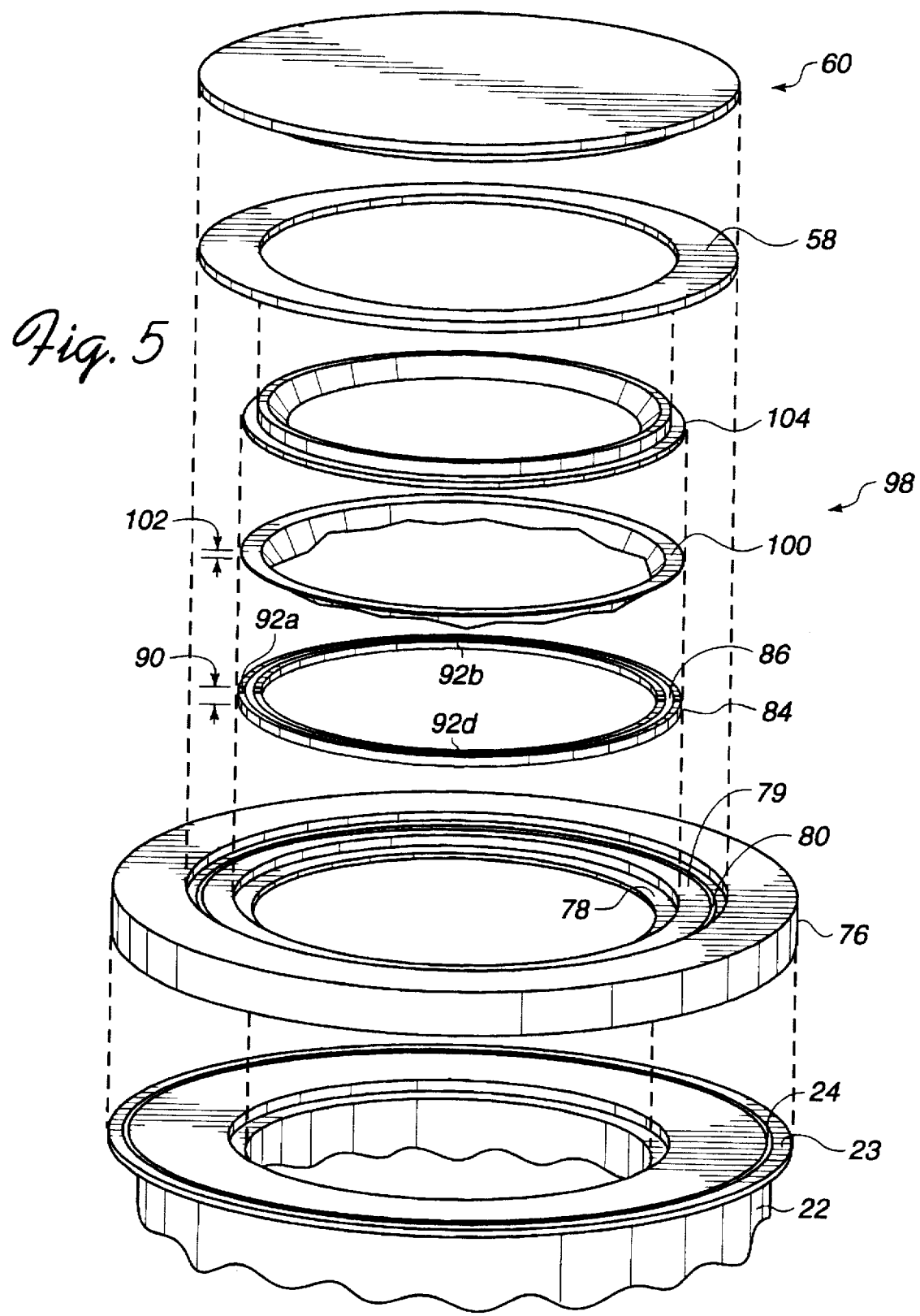
FIG. 5 is an exploded perspective diagram showing an embodiment of a chamber wall of a processing chamber including an upper (flange) portion of the overspray shield and its clamping members according to the invention.
Figure 6:
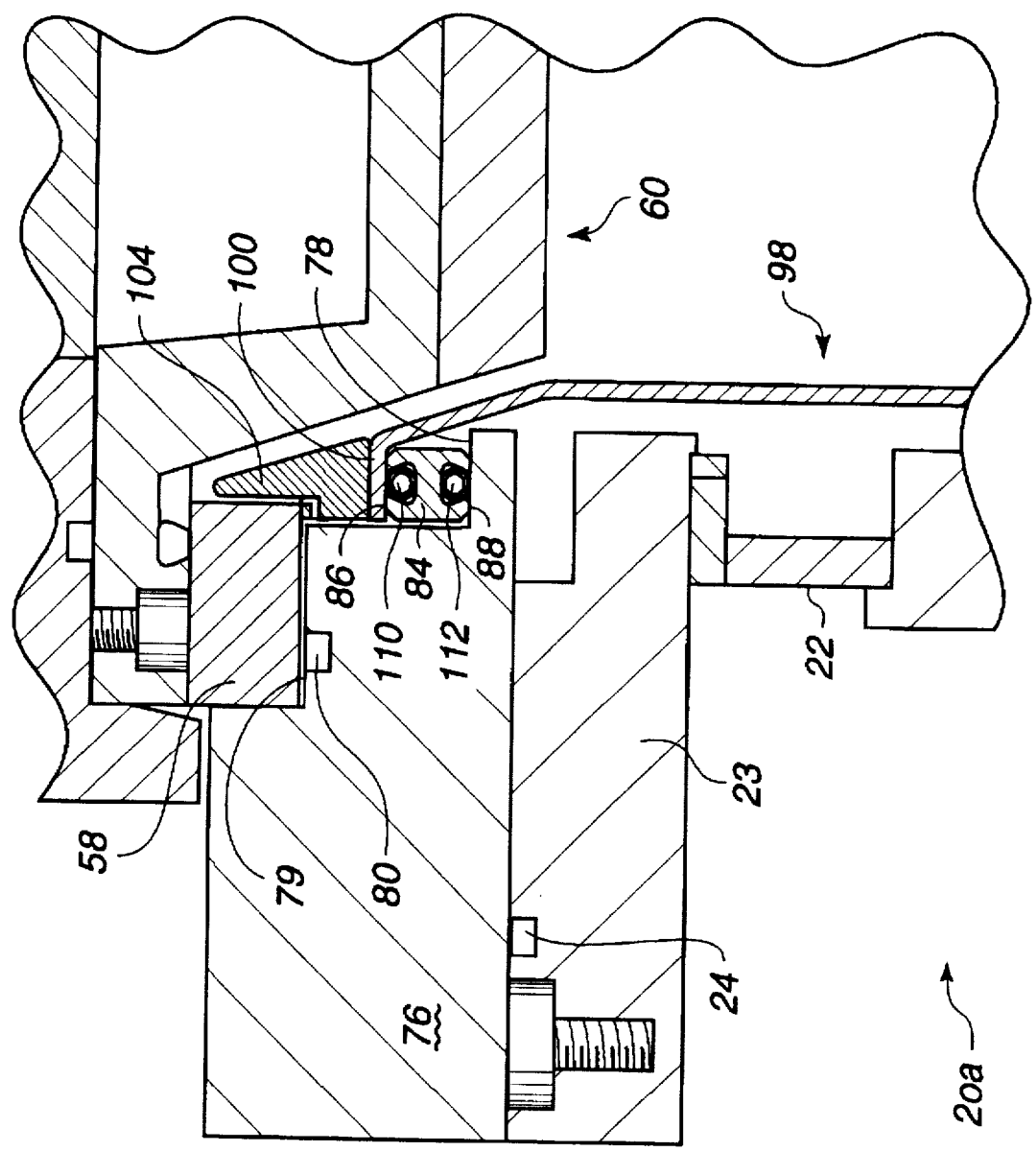
FIG. 6 is a cross section of a wall of a processing chamber of FIG. 5 according to the invention configured to capture the flange of a one piece overspray shield member.

FIG. 5 shows a perspective exploded view of chamber wall (flange) members according to the invention whose assembled cross-section is shown in FIG. 6.

The chamber wall 22, as seen in FIG. 6, is a series of hollow annular pieces or rings welded together to form a continuous cylindrical wall 22. The top of the wall 22 includes a top flange 23 having an O-ring seal groove 24 therein. (The bottom of the wall 22 of the processing chamber is shown cut-away, the actual configuration includes: gas connections, vacuum piping, and vacuum pumps as appropriate for processing a substrate. Similarly, openings in the side of the chamber wall, to insert a substrate into and remove a substrate from the processing chamber, are not shown.)

The configuration of the top of the sealed enclosure wall of the processing chamber 20a as pictured in FIG. 6, includes an adapter ring 76 which generally acts as part of the chamber wall assembly which allows a single processing chamber to be used with a variety of cover plates. The cross sectional shape of the adapter ring 76 may vary depending on its adjacent pieces. Each one is adapted to accommodate an insulating ring and its target configuration while also being configured to seal to the top flange 23 of the wall 22 of the processing chamber by an O-ring seal (not shown) disposed in O-ring groove 24. The adapter plate, in use, acts as part of the wall (or one or more walls (in a chamber with corners) of a processing chamber, and could be integral with the wall if adaptability to other chamber opening cover member configurations is not desired.

The adapter ring 76 includes an insulating ring receiving ledge 79 which includes an O-ring sealing groove 80 facing the bottom of an isolator (insulating) ring 58. The adapter ring 76 also includes a ledge or shelf 78 which terminates at some radial distance less than the inside diameter of the insulating ring 58 so that the clamping ring 104, shield flange 100, and spacer ring 84, can be supported and clamped vertically between the inner lower edge of the insulating ring 58 and the top of the ledge 78. In this configuration the adapter ring lower ledge 78 (or the adapter ring 76, itself), the spacer ring 84, the clamping ring 104, and the insulating ring 58, generally comprise a shield clamping assembly.

The space between the bottom of the insulating ring 58 and the lower ledge 78 of the adapter ring 76 generally comprises a spacer location to receive the sandwich of the clamping ring 104, the shield flange 100, and the spacer ring 84 which are initially loosely positioned, and later, in use, hold the shield flange 100 tightly when the dimensions of the spacer location are diminished, as the shield clamping assembly is clamped, as the processing chamber 20a is evacuated. In the instance when the shield flange is made with precise dimensional tolerances, the spacer location can be configured to clamp the shield flange tightly without the use of a spacer ring (e.g., as pictured in FIG. 2A).

The shelf 78 of the adapter ring 76 in this configuration acts as part of the wall of the processing chamber and can also be identified as being a clamping portion of the wall of the processing chamber.

Under process conditions, the ambient atmospheric pressure creates a clamping force by pressing the chamber opening cover member 60 (e.g. target backing plate in PVD chamber) and its flange tight against the top of the wall assembly oft he processing chamber. This clamping force causes the gas seals (preferably O-ring seals) to tightly seal the processing chamber at each joint in the wall assembly. To achieve the normal process chamber operating pressure of 10 millitorr or less ( base pressure of $10^{-3}$ base pressure (no gas flow) with leak rate of $10^{-9}$ cc/sec), adjacent sealing surfaces in the wall assembly must be manufactured to closely matched precise tolerances. The components of the flange sandwich include: the processing chamber top flange, adapter ring, insulating ring, and chamber opening cover member flange. The sandwich must mate tightly to assure a gas tight (process acceptable) seal and each piece is therefore manufactured to precise tolerances to achieve such a seal.

In contrast to the shield configuration of FIG. 2 (which is manufactured to tight tolerances), the overspray shield 98 as pictured in FIG. 6 is a stamped or spun (made of for example aluminum) member whose outside flange thickness dimension may vary greatly due to manufacturing methods. Any attempt to seal against the rough "as manufactured" finish of the flange would result in a poor seal at best. Precisely machining this outside flange eliminates the economic advantage associated with the low cost of a disposable overspray shield.

Similarly, if it were decided that the overspray shield should be part of the process chamber wall sandwich (as is done for the configuration of FIG. 2) and the upper outer flange of the overspray shield were precisely manufactured to comply with surface finish and dimensional tolerances sufficient to sustain a high vacuum, the overspray shield could be held by the process wall sandwich which could eliminate some complication but would increase the cost due to the more precise tolerances required for the upper outer flange.

The spacer ring 84 (FIGS. 5 and 6), having circumferential O-ring type grooves 86, 88 therein, is configured to rest on the shelf 78 of the of the adapter ring 76 and provide a clamping force for the shield flange 100. In one configuration (FIGS. 6 and 10) both top and bottom grooves 86, 88, 138 are fitted with metal spiral wound spring (high modulus electrically conductive) bands (elastic members) (for example a product known as Spira™ Shield—manufactured by Spira Manufacturing Corporation, North Hollywood, Calif.) which have the outward general appearance of O-rings but are hollow. The elastic members, as shown, are essentially narrow flat ribbons which have been wound into a uniform spiral configuration to form a narrow cylinder which at first glance appears to be an O-ring. However, it is not an O-ring, it is a hollow elastic member which will allow a cross flow of gas and allow gas to be evacuated around and through it. Therefore, when a configuration with this elastic member is in place there is no danger that gas will be trapped behind the elastic member to later affect process conditions non-uniformly. In the configuration of FIG. 6 the clamping ring 104 is pressed downward by the inner edge of the insulating ring 58 to assure electrical contact between the shield top flange 100, the spacer 84, and the adapter ring 76.

Once the elastic members 110, 112 are fitted in the circumferential grooves the side of the rounded/elliptical cross section of the elastic members bulges from the grooves and these bulges are first to elastically and compliantly contact adjacent members in a clamped assembly. Progressively increasing pressure on the spacer ring 84 causes the bulging member(s) 110, 112 to flatten without interfering with the outer vacuum seal, until the extreme limits of the range of spring travel are reached. Within a range of manufacturing limits, the amount of force produced by a given displacement of the elastic member can be chosen by using different model and strength springs to assure electrical contact (continuity) between adjacent pieces throughout the process cycle. One or more such spacer rings securely clamp the flange 100 of the overspray shield 98 in a configuration according to the present invention.

Figure 10:
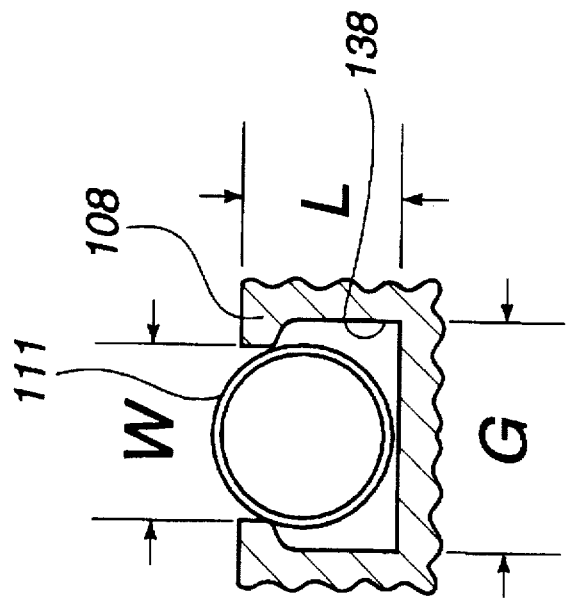
FIG. 10 is a cross section of a groove configuration of an elastic member in a spacer ting according to the invention - configured with a width dimension narrower at the mouth of the groove than the width dimension between the side walls closer to the bottom of the groove.
Figure 9:
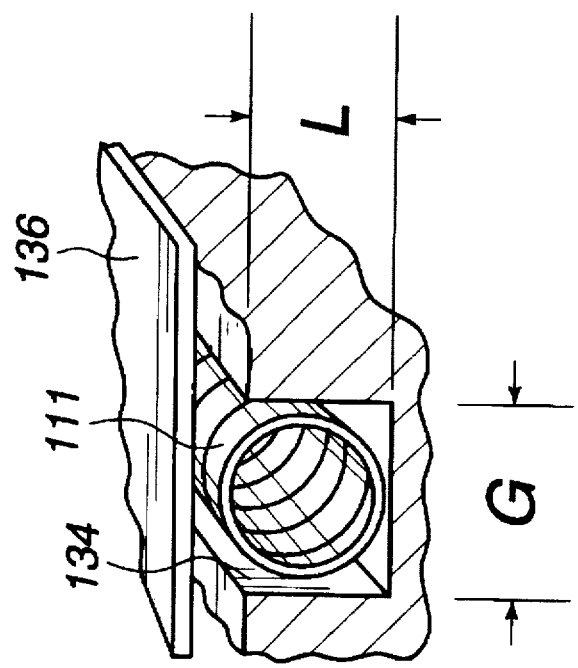
FIG. 9 is a cross section of a groove configuration of an elastic member in a spacer ring according to the invention - configured with plain parallel square cornered walls at the mouth of the groove.

A close-up view of two examples of configurations of elastic members in circumferential grooves is shown in FIGS. 9 and 10. FIG. 9 shows a parallel sided square cornered O-ring-type groove with a metal spiral wound elastic member held in place by a cover member 136. In FIG. 10, a self-retaining groove for the elastic (spring) member 111 is shown. The groove 138 includes parallel side walls whose width narrows at the mouth of the groove. The overhang or lip 108 (FIGS. 7, 10) on the side walls helps prevent the elastic insert 111 from falling out when it is not engaged with an adjacent member, for example, a cover member 136 as shown in FIG. 9.

While two elastic members are, 110, 112, are shown in this configuration and they together provide the capability to accommodate relatively large variations in the thickness of the shield flange 100, one elastic member alone could also be used although the usable compressive range would be reduced.

As an alternative, the elastic circular members in the spacer ring could be replaced by solid O-rings or nearly solid O-rings which may or may not be electrically conductive (if one O-ring is used the opposite surface will achieve electrical contact through a metal to metal clamping contact) to assure electrical conductivity between the overspray shield (s) and the wall of the processing chamber.

Figure 7:
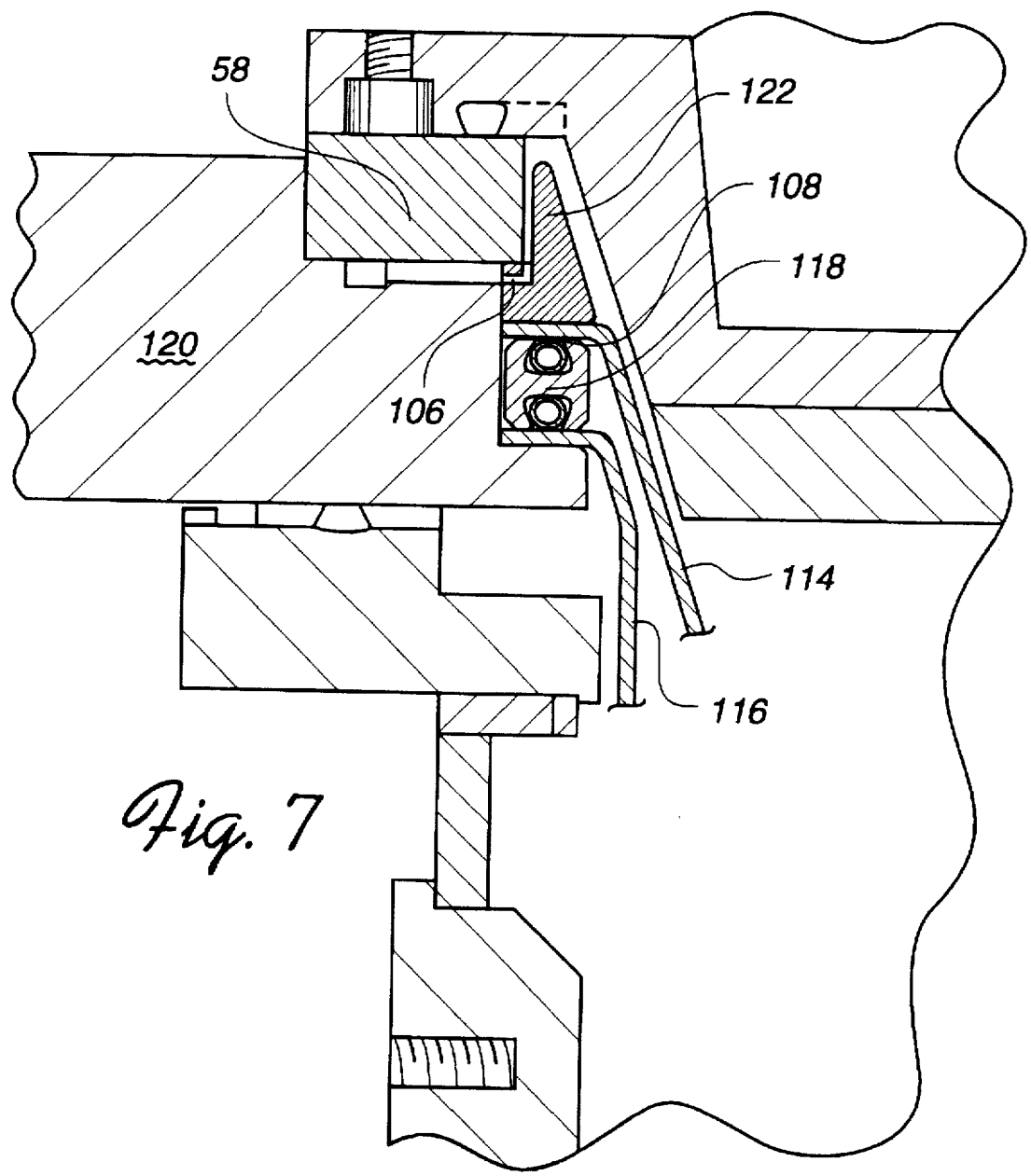
FIG. 7 is a cross section of a wall of a processing chamber according to the invention configured to capture two flanges of shield members; the flanges located both on the top and the bottom of a spacer according to the invention.

The spacer ring 84 includes four (at least one) radial grooves 92a,b,c,d (FIG. 5) on each side (top and bottom) to make sure that all spaces in the processing chamber are easily evacuated and that no gas is trapped (in the case where the elastic members are fully compressed and surface of the spacer ring is touching adjacent pieces). The clamping ring 104 as shown in FIG. 6 and the clamping ting 122 which is shown in FIG. 7 both include an "L" shaped gas passage 106 (FIG. 7) which assures that gas will not be trapped behind the clamping ring. These passages 106 allow gas to pass from the area of the O-ring seal groove 80 facing the insulating ring 58 out into the open evacuated space of the processing chamber. This groove is not continuous but is introduced at one or two (or more) locations around the perimeter.

FIG. 7 shows a cross-section of another embodiment according to the invention. A lower outer shield 116 is partially shadowed by an upper inner shield 114. The lower outer shield 116 includes a circular upper flange which is positioned below the spacer 118. The upper inner shield 114 has an upper outer flange positioned above the spacer 118 and in contact with a clamping ring 122. The clamping ring 122 having the aforementioned L-shaped gas passage 106 there through (for gas release) is pressed by the insulating ring 58 to squeeze the assembled sandwich of flange members. The simplified configuration of the inner upper overspray shield 114 can easily be replaced separate from the lower outer shield 116 when desired.

FIG. 8 provides another configuration according to the invention showing a lower outer overspray shield 131 and an inner upper overspray shield 129. The two shields 131, 129 have their flanges stacked in contact with one another and aligned by a dowel pin 127. A spacer ring 140, with top and bottom grooves as discussed above is in direct contact with the bottom of the insulating ring 58. No separate "floating" clamping ring 104, 122 is used as shown in FIGS. 6 and 7. In the configuration of the upper overspray shield 129 shown, it is clear that the upper overspray shield 129 is formed (bent) to closely approach the chamber opening cover member. While the lower shield 131 descends straight down. Again the upper shield 129 is more easily replaced and more economically replaced, for example if a greater thickness of sputtered deposited material was deposited on it, than the lower outer spaced shield 131.

A configuration according to the invention includes an assembly of precisely manufactured outside sealing members creating an envelope which achieves a gas-fight vacuum seal and also includes a spacer configuration (assembly) which includes sufficient compliance and/or flexibility that even the largest expected dimensional variations of the thickness of the shield flange are accommodated. The vacuum-type seal for the process chamber is made outside the clamping configurations supporting the overspray shields which line the inside of the processing chamber. Electrical conductivity between the overspray shields and the walls of the processing chamber is maintained throughout the range of expected process temperatures (ambient to approximately 200° C.). If the pieces are assembled improperly, gaps between an-mated members will prevent a vacuum-type seal from being formed and prevent process conditions from being achieved unless the members are re-arranged of the pieces to eliminate the misalignment. This is a self-diagnosing arrangement.

Further, elimination of the many, 8 to 16 or more, screws around the adapter ring to secure the clamping ring in the prior art also reduces the likelihood of particulate contamination in the processing chamber due to particulates flaking off (or releasing) as the screws rub on their surrounding surfaces. This results in a more efficient and reliable process.

It will also be understood by persons skilled in the art of the invention that a method for securely clamping an overspray shield is disclosed in using one or more of the structures described above. Such a method includes the steps of: providing a process chamber wall assembly surrounding a substrate processing location of the processing location, placing the flange of an overspray shield in the flange sandwich of the processing chamber wall, and positioning a chamber opening cover member opposite the substrate processing location to create a gas tight seal between the wall assembly and the chamber opening cover member, the chamber opening cover member including a surface facing a portion of the flange sandwich below the chamber opening cover member such that the flange sandwich between the wall assembly and the chamber opening cover member is compressed when a gas tight seal is created and the processing chamber is at least partially evacuated. The shield is configured so that in use removal and replacement of the shield is done without removal and replacement of a set of removable fasteners which in use are disposed inside the processing chamber.

Another method according to the invention includes the steps of: providing the process chamber wall assembly surrounding the substrate processing location of the processing location; placing the flange of an overspray shield in the spacer sandwich with the spacer ring at the spacer location adjacent to the processing chamber wall, the spacer ring having an elastic member which when compressed by an adjacent member urges the adjacent member away from the spacer ring; positioning the chamber opening cover member opposite the substrate processing location creating a gas tight seal between the wall assembly and the chamber opening cover member, the chamber opening cover member including a surface facing the spacer location such that the spacer sandwich is compressed between the wall assembly and the chamber opening cover member when the gas tight seal is created and the processing chamber is at least partially evacuated.

While the invention has been described with regards to specific embodiments, those skilled in the art will recognize that changes can be made in form and detail without departing from the spirit and scope of the invention.

We claim:

1. The configuration for attaching a shield to a substrate processing chamber comprising:
    a substrate processing chamber having walls surrounding a substrate processing location, a top edge of said walls forming a chamber opening;
    a chamber opening cover member spanning said opening and configured to be sealed to said top edge of said chamber walls;
    a shield configured to act as at least a partial barrier preventing process constituents emanating from the substrate processing location from reaching the walls, said shield including an integral flange piece which is securely held and clamped by a clamping force between a portion of said chamber wall and a portion of said chamber opening cover member, wherein at least part of the clamping force to hold and clamp the flange portion is created by evacuation of the substrate processing chamber which causes the cover member and said top edge of said chamber walls to be urged together;
    wherein said flange piece is disposed at a spacer location between said walls of said processing chamber and said chamber opening cover member within said processing chamber and internal to the seal path of a flange sandwich of said chamber opening, wherein the chamber is gas tightly sealed by seals in said flange sandwich;
    wherein said shield is configured so that in use removal and replacement of the shield is done without removal and replacement of a set of removable fasteners which in use are disposed inside the processing chamber.

2. The configuration for attaching a shield to a substrate processing chamber as in claim 1;
    wherein said flange piece as a result of the cover member being urged toward said top edge of said walls of said chamber is urged toward said walls of said chamber and has electrical continuity with the walls of the chamber.

3. A configuration for attaching a shield to a substrate processing chamber comprising:
    a substrate processing chamber assembly having one or more walls surrounding a substrate processing location, a top surface of the one or more walls forming an opening of said chamber,
    a chamber opening cover member being configured to cover the opening of said chamber generally supported from and sealed to said top surface of said one or more walls;
    an insulating ring to electrically isolate the one or more walls of the processing chamber from the chamber opening cover member, the insulating ring is generally configured to be disposed between said top surface of the walls of said chamber and said chamber opening cover member, generally vacuum tight seals being formed between the insulating ring and the top surface of the one or more walls of said chamber and between the insulating ring and said chamber opening cover member;
    a first process chamber shield disposed to act as an internal liner for said one or more walls generally adjacent said substrate processing location, a portion of said shield in use generally acting as a barrier to prevent particles emitted from the processing location from reaching at least a portion of the processing chamber walls, said first process chamber shield including a flange portion;
    a compliant spacer ring located within the processing chamber, said compliant spacer ring being configured to contact said flange portion and together with the flange portion form at least part of a shield clamping assembly, said shield clamping assembly being configured to clamp said flange portion at a spacer location located between said insulating ring and a clamping portion of said one or more walls of said processing chamber assembly, said compliant spacer ring in use providing contact pressure between adjacent members in the shield clamping assembly to assure electrical continuity between the flange portion of said shield and the one or more walls of the processing chamber assembly when a generally vacuum tight seal is formed to permit evacuation of gas molecules present in the processing chamber.

4. The configuration for attaching a shield to a substrate processing chamber as in claim 3,
    wherein said compliant spacer ring includes a generally rigid ring with a cavity therein, said cavity receiving a generally compressible elastic member which in an uncompressed state protrudes beyond a mouth of said cavity and which in use is at least partially compressed and exerts a force on adjacent members in the shield clamping assembly so long as the elastic member is displaced from its uncompressed state.

5. The configuration for attaching a shield to a substrate processing chamber as in claim 4,
    wherein said cavity is a generally continuous groove around said rigid ring, and said elastic member is a tubular structure laid in said groove where a side portion of said tubular structure protrudes beyond the mouth of said cavity.

6. The configuration for attaching a shield to a substrate processing chamber as in claim 3,
   wherein said one or more walls of said processing chamber assembly includes an adapter ring generally configured to be disposed between said top surface of the walls of said chamber and said insulating ring, a generally vacuum tight seal being formed between the adapter ring and the top surface of the one or more walls of said chamber and between the insulating ring and said adapter ring.

7. The configuration for attaching a shield to a substrate processing chamber as in claim 3,
   wherein said shield clamping assembly further includes a clamping ring disposed between said compliant spacer ring and said insulating ring.

8. The configuration for attaching a shield to a substrate processing chamber as in claim 7,
   wherein said clamping ring includes at least one gas passage there through to provide for gas flow from a first side to a second side of said clamping ring without the need for there to be a gas flow path across the surface of the clamping ring between said first and second sides.

9. The configuration for attaching a shield to a substrate processing chamber as in claim 3, further comprising:
   a second process chamber shield disposed to act as an internal liner for said one or more walls generally adjacent said target material, said shield in use generally acting as a barrier to prevent particles emitted from the substrate processing location from reaching at least a portion of the processing chamber walls, said second process chamber shield including a flange portion;
   wherein said flange portion of said first shield is disposed on one side of said compliant spacer ring in said chamber and said flange portion of said second shield is disposed on a second side of said compliant spacer ring as part of said shield clamping assembly,
   wherein said second shield acts as an inside liner for a portion of said first liner.

10. The configuration for attaching a shield to a substrate processing chamber as in claim 3, further comprising:
    a second process chamber shield disposed to act as an internal liner for said one or more walls generally adjacent said substrate processing location, a portion of said second shield in use generally acting as a barrier to prevent particles emitted from the substrate processing location from reaching at least a portion of the processing chamber walls, said second process chamber shield including a flange portion;
    wherein said flange portions of said first shield and of said second shield are disposed adjacent to one another and on a first side of said compliant spacer ring in said chamber as part of said shield clamping assembly,
    wherein said second shield acts as an inside liner for portion of said first liner.

11. The configuration for attaching a shield to a substrate processing chamber as in claim 3,
    wherein said compliant spacer ring generally acts as a floating elastically compressible spacer unit to assist in clamping the flange portion of said first shield in electrical contact with said one or more walls of said processing chamber.

12. The configuration for attaching a shield to a substrate processing chamber as in claim 3,
    wherein said first shield generally spans a gap between the edge of a pedestal supporting the substrate to be processed and the one or more walls of the processing chamber.

13. A method of attaching a shield to a substrate processing chamber comprising the steps of:
    providing a process chamber wall assembly surrounding a substrate processing location of the processing location;
    placing a flange of an overspray shield in a spacer sandwich with a compliant spacer ring at a spacer location internal to said processing chamber wall, said compliant spacer ring having an elastic member which when compressed by an adjacent member urges the adjacent member away from said compliant spacer ring;
    positioning a chamber opening cover member opposite said substrate processing location,
    creating a gas tight seal between an outer portion of said wall assembly and said chamber opening cover member,
    wherein a portion of said chamber opening cover member includes a surface internal to a seal location of said cover member, said surface facing said spacer location such that the spacer sandwich is compressed between said wall assembly and said surface when a gas tight seal is created at said seal location between an outer portion of said wall assembly and said chamber opening cover member and said processing chamber is at least partially evacuated.

14. A configuration for attaching a shield to a substrate processing chamber comprising:
    a substrate processing chamber assembly having one or more walls surrounding a substrate processing location, a top surface of the one or more walls forming an opening of said chamber,
    a chamber opening cover member being configured to cover the opening of said chamber generally supported from and sealed to said top surface of said one or more walls;
    an insulating ring to electrically isolate the one or more walls of the processing chamber from the chamber opening cover member, the insulating ring is generally configured to be disposed between said top surface of the walls of said chamber and said chamber opening cover member, generally vacuum tight seals being formed between the insulating ring and the top surface of the one or more walls of said chamber and between the insulating ring and said chamber opening cover member;
    a first process chamber shield disposed to act as an internal liner for said one or more walls generally adjacent said substrate processing location, a portion of said shield in use generally acting as a barrier to prevent particles emitted from the processing location from reaching at least a portion of the processing chamber walls, said first process chamber shield including a flange portion;
    a spacer ring located within the processing chamber, said spacer ring being configured to contact said flange portion and together with the flange portion form at least part of a shield clamping assembly, said shield clamping assembly being configured to clamp said flange portion at a spacer location located between said insulating ring and a clamping portion of said one or more walls of said processing chamber assembly, said spacer ring in use providing contact pressure between adjacent members in the shield clamping assembly to assure electrical continuity between the flange portion of said shield and the one or more walls of the processing chamber assembly when a generally vacuum tight seal is formed to permit evacuation of gas molecules present in the processing chamber, wherein said spacer ring includes a generally rigid ring with a cavity therein, said cavity receiving a generally compressible elastic member which in an uncompressed state protrudes beyond a mouth of said cavity and which in use is at least partially compressed and exerts a force on adjacent members in the shield clamping assembly so long as the elastic member is displaced from its uncompressed state.

15. The configuration for attaching a shield to a substrate processing chamber as in claim 14, wherein said cavity is a generally continuous groove around said rigid ring, and said elastic member is a tubular structure laid in said groove where a side portion of said tubular structure protrudes beyond the mouth of said cavity.

16. A configuration for attaching a shield to a substrate processing chamber comprising:

a substrate processing chamber assembly having one or more walls surrounding a substrate processing location, a top surface of the one or more walls forming an opening of said chamber, a chamber opening cover member being configured to cover the opening of said chamber generally supported from and sealed to said top surface of said one or more walls;

an insulating ring to electrically isolate the one or more walls of the processing chamber from the chamber opening cover member, the insulating ring is generally configured to be disposed between said top surface of the walls of said chamber and said chamber opening cover member, generally vacuum tight seals being formed between the insulating ring and the top surface of the one or more walls of said chamber and between the insulating ring and said chamber opening cover member;

a first process chamber shield disposed to act as an internal liner for said one or more walls generally adjacent said substrate processing location, a portion of said shield in use generally acting as a barrier to prevent particles emitted from the processing location from reaching at least a portion of the processing chamber walls, said first process chamber shield including a flange portion;

a spacer ring located within the processing chamber, said spacer ring being configured to contact said flange portion and together with the flange portion form at least part of a shield clamping assembly, said shield clamping assembly being configured to clamp said flange portion at a spacer location located between said insulating ring and a clamping portion of said one or more walls of said processing chamber assembly, said spacer ring in use providing contact pressure between adjacent members in the shield clamping assembly to assure electrical continuity between the flange portion of said shield and the one or more walls of the processing chamber assembly when a generally vacuum tight seal is formed to permit evacuation of gas molecules present in the processing chamber, wherein said shield clamping assembly further includes a clamping ring disposed between said spacer ring and said insulating ring, wherein said clamping ring includes at least one gas passage there through to provide for gas flow from a first side to a second side of said clamping ring without the need for there to be a gas flow path across the surface of the clamping ring between said first and second sides.

* * * * *